United States Patent [19]

Vul et al.

[11] 3,872,300

[45] Mar. 18, 1975

[54] OPTOELECTRONIC DEVICE

[76] Inventors: Alexandr Yakovlevich Vul, prospekt Proveschenia, 104, kv. 192; Alexandr Yakovlevich Shik, Torzhkovskaya ulitsa, 2, korpus 2, kv. 34, both of Leningrad; Natalia Alexandrovna Dobryakova, ulitsa Karla Marxa, 34/30, Leningradskaya oblast; Ibragim Ibragimovich Saidashev, Yakovskaya ulitsa, 8, kv. 115; Jury Vasilievich Shmartsev, prospekt Toreza, 9, kv. 1, both of Leningrad, all of U.S.S.R.

[22] Filed: Mar. 1, 1974

[21] Appl. No.: 447,391

[30] Foreign Application Priority Data

Mar. 3, 1973 U.S.S.R. .............................. 1895849

[52] U.S. Cl. .............. 250/205, 250/211 R, 250/552

[51] Int. Cl. ....... G01j 1/32, G02f 1/28, H01j 39/12

[58] Field of Search ................. 250/205, 552, 211 R

[56] References Cited

UNITED STATES PATENTS

| | | | |
|---|---|---|---|
| 1,988,274 | 1/1935 | Glaser | 250/205 X |
| 3,210,549 | 10/1965 | Van Santen et al. | 250/205 X |

*Primary Examiner*—James W. Lawrence
*Assistant Examiner*—T. N. Grigsby
*Attorney, Agent, or Firm*—Holman & Stern

[57] ABSTRACT

An optoelectronic device comprising a photoconductor and an emitter which are electrically interconnected, the photoconductor being made from low-resistance semiconductor material with high-resistance inclusions forming $n^+n$ or $p^+p$ junctions at their boundaries in accordance with the type of conductivity of said semiconductor material, which ensures the generation of infralow-frequency electric oscillations.

4 Claims, 4 Drawing Figures

PATENTED MAR 18 1975 3,872,300

OPTOELECTRONIC DEVICE

The present invention relates to solid-state electronics, and more particularly to optoelectronic devices.

The invention can most advantageously be used for obtaining infralow-frequency electric oscillations and employed in automatic control and telecontrol systems.

Generally, by infralow frequencies is meant the band of frequencies from $10^{-2}$ to 10 Hz. Generation and conversion of infralow-frequency signals by the methods applicable to the low-frequency band are practically ineffective.

This is due to the fact that to generate an infralow-frequency alternating voltage oscillator circuitry elements determining the oscillation frequency should have parameters whose values are well in excess of the universally adopted limits. Therewith, such oscillators have poor stability and difficulties arise in maintaining the required shape of the oscillations being generated.

As to their operating principle, the oscillators known at present can be divided into two categories: electromechanical and electronic oscillators.

Electromechanical infralow-frequency oscillators are based on electromechanical transducers the output electrical energy whereof varies under the effect of the input mechanical energy variable. Such transducers are exemplified by a significant number of devices converting nonelectrical values into electrical (inductance, capacity, potentiometric and other transducers).

A disadvantage common to practically all electromechanical oscillators resides in the low stability of their frequency characteristics, their big size and difficulties in controlling their output energy value.

Electronic infralow-frequency oscillators are built around self-excitation circuits and use the principle of conversion of electric oscillations. They include beat-frequency and thermystor oscillators. Through the use of such oscillators one can obtain oscillations within the range of frequencies from 2.10 to $10^{-2}$ Hz, however their stability in the vicinity of $10^{-2}$ Hz is poor, and it is practically impossible to obtain frequencies below $10^{-3}$ Hz. To obtain electric oscillations of frequencies lower than $10^{-2}$ Hz use is usually made of low-frequency oscillators built around flip-flop circuits ensuring longer time intervals between signals. In this case, however, the necessity to use flip-flop circuits substantially complicates the oscillator circuitry and lowers the reliability of its operation.

Thus, it is most difficult to provide electronic oscillators generating frequencies in the vicinity of $10^{-2}$ Hz, and particularly frequencies below $10^{-3}$ Hz.

An optoelectronic device is known, comprising a photoconductive element and an emitting (electroluminescent) elements arranged in parallel and connected in a feedback circuit in series with a d-c voltage source (battery), a switch and an impedance element having an impedance much lower than that of the photoconductive element when it is dark, but much higher than that of said element when it is illuminated.

The emitter has been selected such that it starts emitting light as it is energized with a voltage equal to the voltage drop across the dark photoconductor, and stops emitting light when said voltage is lower than the voltage drop across the photoconductor. The above optoelectronic device operates as follows. When the switch is closed, the impedance of the dark photoconductor being much higher than that of the impedance element, a major portion of the voltage supplied by the source is applied across the parallel elements and the electroluminescent element emits light. As a result, the impedance of the photoconductor begins to decrease and the voltage drop between the photoconductor and the impedance element is redistributed. A decrease in the voltage drop across the photoconductor brings about a corresponding decrease in the voltage drop across the emitter and the latter stops emitting light. When the emitter is energized, the impedance of the photoconductor increases again and the process is periodically repeated with the result that electric oscillations are generated by the device, i.e., it functions as an oscillator.

The prior art optoelectronic device, however, suffers from a serious disadvantage residing in that the range of frequencies of the generated electric signals is limited on the side of low frequencies and cannot be extended to cover frequencies below unities of Hz. This is due to the fact that the frequency of the generated signals in the prior art optoelectronic device is determined by the photoresponse time of the photoconductor, which is no more than $10^{116\ 2}$ sec per 100 Hz. It is an object of the present invention to provide a semiconductor optoelectronic device generating infralow-frequency electric oscillations in the range of frequencies below unities of Hz.

This object is attained by that in an optoelectronic device comprising a photoconductor and an emitter which are electrically interconnected, the photoconductor is, according to the invention, made from low-resistance semiconductor material with high-resistance inclusions forming $n^+n$ or $p^+p$ junctions at their boundaries in accordance with the type of conductivity of said semiconductor material, which ensures the generation of infralow-frequency electric oscillations.

It is expedient to use as the low-resistance semiconductor material, n-type gallium antimonide doped with sulphur and cooled to a temperature below 100°K, and, as the emitter, a source of light having a spectral composition of emission within the range of 0.2 to 2.6 eV.

The optoelectronic device of the present invention is characterized by that the photoconductor thereof features high controlled photoresponse time whereby infralow-frequency electric oscillations can be generated.

The invention will now be described in greater detail with reference to a preferred embodiment thereof, taken in conjunction with the accompanying drawings, wherein.

Figure 1:
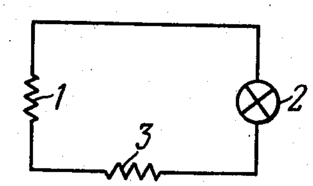
FIG. 1 is a block diagram of an optoelectronic device, according to the invention.

Referring now to FIG. 1, the optoelectronic device of the present invention comprises a photoconductor 1 and an emitter 2, both elements being electrically interconnected via a feedback circuit 3.

Figure 2:
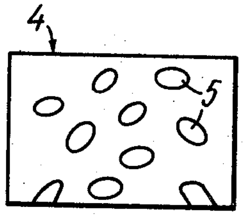
FIG. 2 shows the structure of the photoconductor material, according to the invention.

The photoconductor 1 is made from a low-resistance conductor material 4 (FIG. 2) with high-resistance inclusions 5 which form $n^+n$ or $p^+p$ junctions (according to the type of conductivity of said low-resistance semiconductor material 4) on their boundaries. Accordingly, in the n-type low-resistance semiconductor material there are formed $n^+n$ junctions, and $p^+p$ junctions are formed in the p-type material.

Consider now the cause why photoconductor 1, made from the low-resistance semiconductor material 4 with high-resistance inclusions 5, features specific properties.

The high-resistance inclusions 5 may form areas having a different, as compared to the low-resistance semiconductor material 4, concentration of the dopant and/or a different dopant ionization energy. Such materials may be solid solutions of semiconducting compounds of gallium arsenide, gallium phosphide, both compounds being doped with sulphur, as well as cadmium telluride doped with chlorine and germanium doped with oxygen.

As a result of electron redistribution between the low-resistance semiconductor material 4 and the high-resistance inclusions 5, $n^+n$ (or $p^+p$) junctions are formed at the boundaries of these inclusions, which create a contact potential difference at said boundaries.

The illumination of the photoconductor 1, made from a material having the above structure, with the light of the emitter 2 during a period of time $\Delta t$ brings about the appearance of $\Delta n$ unpaired electrons in the condition band, which results in a practically instantaneous increase in the conduction of the photoconductor 1. When the photoconductor 1 is dark, the electronic equilibrium between the low-resistance semiconductor material 4 and the high-resistance inclusions 5 therein as restored.

As soon as said equilibrium is established, part of the $\Delta n$ unpaired electrons are captured by the impurity sites of the inclusions 5 of the photoconductor 1. Since the process of unpaired electron capture involves crossing potential barriers, having a value $\phi$, at the boundaries of the inclusions 5, it is, consequently, determined by the time constant $\tau \sim \exp(\phi/KT)$, where $K$ is the Boltzmann constant, and $T$ is temperature: the value $\phi$ can be defined as the contact potential difference. Owing to this, as the emitter 2 is deenergized, the impedance of the photoconductor 1, determined by the concentration of electrons in the low-resistance semiconductor material 4 will, after a period of time $\Delta t$, increase with the time constant $\tau$. The value of $\tau$ is only determined by the parameters of the $n^+n$ (or $p^+p$) junction and can be made as high as may be required in accordance with the value of $\phi/KT$, i.e., by the proper concentration and/or type of dopant and/or temperature.

Thus, the photoresponse time of the photoconductor 1, made from the low-resistance semiconductor material 4 with the high-resistance inclusions 5 which form $n^+n$ (or $p^+p$) junctions at the boundaries thereof, can practically be made as high as may be required, too. By the photoresponse time, for photoconductors of the above structure, is meant the time required to attain the equilibrium conduction value after photoexcitation, rather than the time of instantaneous increase in the conduction of the photoconductor as it is exposed to light. Hence, an optoelectronic device having such a photoconductor can generate electric oscillations practically of as low frequencies as may be required.

Recommended for use as the low-resistance material 4 with high-resistance inclusions 5 is n-type gallium antimonide doped with sulphur, n-GaSb(S). The low-resistance bulk of this material represents a region wherein sulphur forms donor levels with an ionization energy of 60 neV millielectron-volts), while the high-resistance inclusions 5 represent regions in which sulphur forms donor levels with a higher ionization energy. As a result, $n^+n$ junctions are formed at the boundaries of the regions 4 and 5 in n-GaSb(S) with a contact potential difference$\phi \approx 0.2$ eV.

Consequently, for the optoelectronic device to generate infralow-frequency oscillations, the photoconductor 1 made from n-GaSb(S) has to be cooled down to a temperature at which $\phi/KT > 1$, e.g. to a temperature below 100°K.

The conduction of the photoconductor 1 can be made to vary by light emission with a photon energy higher than the ionization energy of donors in the low-resistance semiconductor 4 for impurity states associated with the non-absolute extremum of the conduction band (with emphasis being put on the energy spacing between extrema). Since in the semiconductor material, n-GaSb(S), the impurity state of sulphur with an ionization energy of 60 meV is associated with the additional extremum $L_1$ of the conduction band, rather than with the absolute extremum $\Gamma_1$ thereof, and the energy gap between the extrema is 80 meV, the emitter 2 should be selected such as to have a quantum energy of 0.2 eV. At the same time, since at high energies of photons of the incident light the surface layer of the material absorbs more light, the spectral composition of the light emitted by the emitter 2 is limited on the side of high energies. When n-GaSb(S) is used as the low-resistance semiconductor material, the absorption of light by its surface layer is materially affected at photon energies exceeding 2 eV, therefore the spectral composition of the light incident upon the photoconductor 1, made from n-GaSb(S), of the optoelectronic device of the present invention, should fall within the range of 0.2 to 2 eV.

Let us now turn to the dynamics of the process of alteration of the conduction of the photoconductor 1 made from n-GaSb(S) under the effect of light pulses emitted by the emitter 2, the spectral composition of the emitted light ranging from 0.2 to 2 eV.

Figure 3:
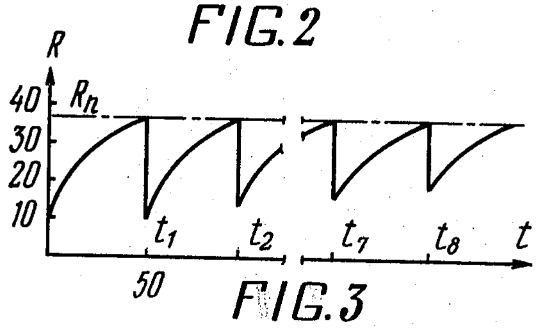
FIG. 3 is a graph showing the impedance of the photoconductor made from n-GaSb(S) versus time, as it is periodically illuminated, according to the invention.

After the photoconductor 1 has been cooled down to a temperature of about 100°K, its impedance starts to increase. If at an instant $t_1$ (FIG. 3), when the impedance of the photoconductor 1 (FIG. 1) reaches a value $R_n$, the emitter 2 is energized for a period of time $\Delta t$, the impedance of the photoconductor 1 drops almost instantaneously, then, after the emitter 2 has been de-energized, the impedance increased again. If, after the impedance of the photoconductor 1 has reached the value $R_n$ the emitter 2 is re-energized, the process repeats itself. FIG. 3, in which the impedance R of the photoconductor 1 is shown plotted on the ordinate, illustrates this periodically repeating process of increase and decrease in the impedance of the photoconductor 1 made from n-GaSb(S) and cooled down to about 100°K with the emitter 2 being energized at instants, $t_1$, $t_2$, $t_3$..., and the photon energy being 1.33 eV.

It can be inferred from FIG. 3 that for the optoelectronic device of the present invention to be capable of generating infralow-frequency electric oscillations, the feedback circuit 3 should be such as to energize the emitter 2 as soon as the impedance of the photoconductor 1 reaches a value $R_n$ and de-energize it after a period of time Δt.

It can also be seen from FIG. 3 that the amplitude of variation of the impedance of the photoconductor 1 slightly decreases from pulse to pulse, which may affect the stability of the oscillation frequency. Therefore, both the period of time Δ t and the intensity of light emitted by the emitter 2 are selected such as to ensure periodic repetition of the process. With this requirement in mind, the feedback circuit 3 has been made such as to energize the emitter 2 as soon as the impedance of the photoconductor 1 becomes equal to about 30 ohms for $\Delta t = 20$ sec. The emitter 2 is a gallium arsenide photodiode the emission intensity whereof is proportional to the intensity of the current therethrough, which has been selected equal to 25 mA.

The optoelectronic device of the present invention operates as follows.

After the photoconductor 1 (FIG. 1) has been cooled down to a temperature at which $\phi/KT >> 1$, its impedance starts to slowly increase to a value $R_n$ (operating threshold) (FIG. 3), whereupon the feedback circuit 3 energizes the emitter 2 for a period of time $\Delta t$, the impedance of the photoconductor 1 falls abruptly and, after the emitter 2 has been de-energized, starts to slowly increase, with the time constant $\tau \sim \exp(\phi/KT)$, back to the value $R_n$, and the process repeats itself.

Figure 4:
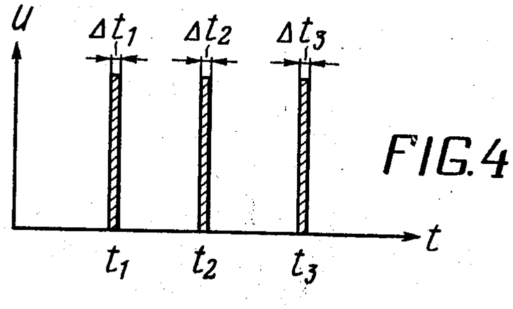
FIG. 4 is a graph illustrating low-frequency pulses appearing at the terminals of the emitter of the optoelectronic device, according to the invention.

The dependence of the voltage U across the terminals of the emitter 2 on the time t is shown in FIG. 4. At an instant $t_1$, the impedance of the photoconductor 1 reaches the value $R_n$ and the feedback circuit 3 energizes the emitter 2 for a period $\Delta t = \Delta t_1$ ($= \Delta t_2 = \Delta t_3$). At instant $t_2$ and $t_3$, the process is repeated. As can be seen from FIG. 4, the voltage across the terminals of the emitter 2 is in the form of pulses recurring at a frequency inversely proportional to the time constant $\tau$.

With preselected values of the impedance ($R_n$), the duration ($\Delta t$) of a light pulse, the intensity of the light emitted by the emitter 2 and temperature (T) to which the photoconductor 1 made from n-GaSb(S) is cooled, the frequency of the electric oscillations generated by the proposed optoelectronic device is equal to about $10^{-2}$ Hz.

Thus, by using the optoelectronic device of the present invention one can obtain infralow-frequency electric oscillations. The range of frequencies on the side of low frequencies is not limited, and the frequency of the generated signals can be made as low as may be required.

What is claimed is:

1. An optoelectronic device comprising a photoconductor provided with two leads and made from low-resistance n-type semiconductor material with high-resistance inclusions forming $n^+n$ junctions at the boundaries thereof, and an emitter also provided with two leads, one being connected to one of the leads of said photoconductor and the other being connected to the second lead of said photoconductor.

2. An optoelectronic device as claimed in claim 1, wherein used as said low-resistance semiconductor material is n-type gallium antimonide doped with sulphur and cooled down to a temperature below 100°K, and used as said emitter is a source of light with a spectral composition falling within the range of 0.2 to 2 eV.

3. An optoelectronic device comprising a photoconductor provided with two leads and made from low-resistance p-type semiconductor material with high-resistance inclusions forming $p^+p$ junctions at the boundaries thereof, and an emitter also provided with two leads, one being connected to one of the leads of said photoconductor and the other being connected to the second lead of said photoconductor.

4. An optoelectronic device as claimed in claim 3, wherein used as said low-resistance semiconductor material is p-type gallium antimonide doped with sulphur and cooled down to a temperature below 100°K, and used as said emitter is a source of light with a spectral composition falling within the range of 0.2 to 2 eV.

* * * * *